(12) United States Patent
Kwak et al.

(10) Patent No.: US 9,728,701 B2
(45) Date of Patent: Aug. 8, 2017

(54) THERMOELECTRIC GENERATION APPARATUS

(71) Applicant: HYUNDAI MOTOR COMPANY, Seoul (KR)

(72) Inventors: Jin Woo Kwak, Gyeongsan-Si (KR); In Woong Lyo, Suwon-si (KR); Kyong Hwa Song, Seoul (KR); Han Saem Lee, Seoul (KR); Hong Kil Baek, Seoul (KR); In Chang Chu, Seoul (KR); Gyung Bok Kim, Seoul (KR); Su Jung Noh, Seoul (KR); Seung Woo Lee, Seoul (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 0 days.

(21) Appl. No.: 14/811,404

(22) Filed: Jul. 28, 2015

(65) Prior Publication Data

US 2016/0225974 A1    Aug. 4, 2016

(30) Foreign Application Priority Data

Feb. 2, 2015    (KR) .......................... 10-2015-0015875

(51) Int. Cl.
```
H01L 35/28    (2006.01)
H01L 35/30    (2006.01)
F02G 5/02     (2006.01)
```
(52) U.S. Cl.
CPC ................ *H01L 35/30* (2013.01); *F02G 5/02* (2013.01); *Y02T 10/166* (2013.01)

(58) Field of Classification Search
CPC ........... F02G 5/02; H01L 35/30; H01L 35/28; Y02T 10/166; H02N 11/002

(Continued)

(56) References Cited

U.S. PATENT DOCUMENTS 6,397,618 B1 * 6/2002 Chu ................... F25B 25/00
                                                165/104.22
6,451,422 B1 * 9/2002 Nguyen ............... B32B 27/12
                                                106/270

(Continued)

FOREIGN PATENT DOCUMENTS

JP    9-148636 A      6/1997
JP    2000-035824 A   2/2000

(Continued)

OTHER PUBLICATIONS

Korean Notice of Allowance dated Oct. 24, 2016 issued in Korean Patent Application No. 10-2015-0015875.
Korean Office Action dated Apr. 22, 2016 issued in Korean Patent Application No. 10-2015-0015875.

*Primary Examiner* — Thanh-Truc Trinh

(74) *Attorney, Agent, or Firm* — McDermott Will & Emery LLP

(57) ABSTRACT

A thermoelectric generation apparatus includes a heat absorbing surface configured to absorb heat from an internal combustion engine, a heat generating surface bonded to the heat absorbing surface by a semiconductor and configured to discharge the heat to the outside, and a conductive converting part interposed between the heat absorbing surface and the internal combustion engine. The conductive converting part is configured to allow the heat to be conducted from the internal combustion engine to the heat absorbing surface when a temperature of the internal combustion engine is equal to or greater than a specific value.

12 Claims, 4 Drawing Sheets

(58) Field of Classification Search
USPC .................................................. 136/200–242
See application file for complete search history.

(56) References Cited

U.S. PATENT DOCUMENTS

| | | | |
|---|---|---|---|
| 6,914,343 B2 | 7/2005 | Hiller et al. | |
| 2006/0246806 A1* | 11/2006 | Rhine | B01J 13/0091 442/417 |
| 2009/0090409 A1* | 4/2009 | Moczygemba | H01L 35/34 136/201 |
| 2012/0073276 A1* | 3/2012 | Meisner | H01L 35/30 60/320 |
| 2012/0152297 A1 | 6/2012 | Mitchell et al. | |
| 2013/0019623 A1* | 1/2013 | Jo | F25D 11/025 62/190 |
| 2013/0098417 A1 | 4/2013 | Gavillet | |

FOREIGN PATENT DOCUMENTS

| | | |
|---|---|---|
| JP | 2003-111459 A | 4/2003 |
| JP | 2006-207485 A | 8/2006 |
| JP | 2012-129519 A | 7/2012 |
| JP | 2013-531458 A | 8/2013 |
| KR | 10-2011-0045409 A | 5/2011 |
| KR | 10-2013-0107389 A | 10/2013 |
| KR | 10-2013-0128163 A | 11/2013 |
| KR | 10-1391159 B1 | 5/2014 |
| WO | 2012/038917 A1 | 3/2012 |

* cited by examiner

THERMOELECTRIC GENERATION APPARATUS

CROSS-REFERENCE TO RELATED APPLICATION

This application is based on and claims the benefit of priority to Korean Patent Application No. 10-2015-0015875, filed on Feb. 2, 2015 in the Korean Intellectual Property Office, the disclosure of which is incorporated herein in its entirety by reference.

TECHNICAL FIELD

The present disclosure relates to a thermoelectric generation apparatus, and more particularly, to a thermoelectric generation apparatus capable of generating electric power by absorbing heat of an internal combustion engine only when a temperature of the internal combustion engine is a specific value or more using a phase change material phase-changed at a specific temperature.

BACKGROUND

Thermoelectric generation is power generation using the Seebeck effect that electromotive force is generated when a temperature difference is provided to both ends of a material. Since a thermoelectric generator using the Seebeck effect does not include a dynamic component and directly converts heat into electricity within a material without separately requiring a fuel, it has very high stability and does not exhaust an environment pollution material. Meanwhile, in order to recover energy discharged as heat during an operation of an internal combustion engine, the thermoelectric generation has been used.

However, when the thermoelectric generator is mounted in the internal combustion engine, heat of the internal combustion engine is absorbed by the thermoelectric generator to lower a temperature of exhaust gas exhausted from the internal combustion engine. It has a negative influence on activity of various post-processing apparatuses mounted in an exhaust pipe in order to purify the exhaust gas exhausted from the internal combustion engine. The reason is as follows. The various post-processing apparatuses are activated at a temperature of 500 to 700° C. to oxidize or reduce NOx, SOx, and PM. However, when the thermoelectric generator is operated, a temperature of the exhaust gas is excessively lowered, such that the temperature of the exhaust gas should be further raised as compared with the related art.

In addition, in the thermoelectric generator mounted in the internal combustion engine according to the related art, heat is transferred from the internal combustion engine to the thermoelectric generator through direct conduction or convection of exhaust heat. However, a constant open circuit voltage may not be obtained due to an excessive temperature fluctuation of the internal combustion engine.

RELATED ART DOCUMENT

Patent Document (Patent Document 1) Korean Patent Publication No. 10-1391159 (published on Apr. 25, 2014)

SUMMARY

The present disclosure has been made to solve the above-mentioned problems occurring in the prior art while advantages achieved by the prior art are maintained intact.

An aspect of the present inventive concept provides a thermoelectric generation apparatus capable of obtaining a constant open circuit voltage without having a negative influence on activity of a post-processing apparatus by allowing a thermoelectric generator to absorb heat of an internal combustion engine when a temperature of the internal combustion engine is equal to or greater than a specific temperature.

According to an exemplary embodiment of the present inventive concept, a thermoelectric generation apparatus includes: a heat absorbing surface configured to absorb heat from an internal combustion engine; a heat generating surface bonded to the heat absorbing surface by a semiconductor and configured to discharge the heat to the outside; and a conductive converting part interposed between the heat absorbing surface and the internal combustion engine and configured to allow the heat to be conducted from the internal combustion engine to the heat absorbing surface when a temperature of the internal combustion engine is equal to or greater than a specific value.

In certain embodiments, the conductive converting part may have a phase change material therein, and the phase change material may be capable of phase-changing from a solid phase to a liquid phase and being expanded when the heat transferred from the internal combustion engine is equal to or greater than a heat reference value.

In certain embodiments, the specific value is greater than or equal to an activity temperature of an exhaust gas post-processing apparatus mounted in an exhaust pipe.

In certain embodiments, the phase change material may contain a mixed filler that raises thermal conductivity, wherein the mixed filler is 50 wt % or more of the phase change material.

In certain embodiments, the mixed filler may be selected from the group consisting of graphite, carbon fiber, ceramic fiber, various metal fillers, and mixtures thereof.

In certain embodiments, the conductive converting part may include a base surface attached to a surface of the internal combustion engine and a plurality of insulation pillars protruding from the base surface at a predetermined height and attached to the heat absorbing surface. In certain embodiments, the phase change material may be inserted into a plurality of spaces formed between the insulation pillars.

In certain embodiments, the base surface may be horizontal to the heat absorbing surface.

In certain embodiments, a volume of the phase change material inserted into the spaces may be less than a volume of the spaces.

In certain embodiments, the phase change material may connect the base surface to the heat absorbing surface after being expanded during a phase change.

In certain embodiments, the base surface may include a conductive ceramic.

In certain embodiments, the insulation pillar may include an aerogel having low thermal conductivity or a high heat resistance plastic.

In certain embodiments, the base surface may have a plurality of pins formed thereon, and the pins may protrude toward the plurality of spaces formed between the insulation pillars.

In certain embodiments, the heat absorbing surface and the heat generating surface may each have a plurality of conductive metal portions attached thereto, and the conductive metal portions attached to the heat absorbing surface and the conductive metal portions attached to the heat generating surface may be connected in series through n-type materials and p-type materials.

In certain embodiments, a cooling jacket in which a coolant moves, a cooling fin, or a cooling pipe protruding toward air moving outside of the may be mounted on the heat generating surface.

In another aspect, a thermoelectric generation apparatus may include a thermoelectric element attached to an internal combustion engine and a phase change material mounted on an attachment part between the internal combustion engine and the thermoelectric element so that heat is conducted from the internal combustion engine to the thermoelectric element when a temperature of the internal combustion engine is equal to or greater than a specific value.

In another aspect, a thermoelectric generation apparatus may include a thermoelectric element attached to an internal combustion engine, a plurality of insulation pillars interposed between the internal combustion engine and the thermoelectric element, and a phase change material inserted in a plurality of spaces formed between the insulation pillars. A volume of the phase change material inserted into the spaces may be less than a volume of the spaces, and the phase change material may connect the internal combustion engine to the thermoelectric element when a temperature of the internal combustion engine is greater than or equal to an activity temperature of an exhaust gas post-processing apparatus mounted in an exhaust pipe.

BRIEF DESCRIPTION OF THE DRAWINGS

The above and other objects, features and advantages of the present inventive concept will be more apparent from the following detailed description taken in conjunction with the accompanying drawings.

DETAILED DESCRIPTION

Exemplary embodiments of the present inventive concept will be described in detail with reference to the accompanying drawings.

Figure 1:
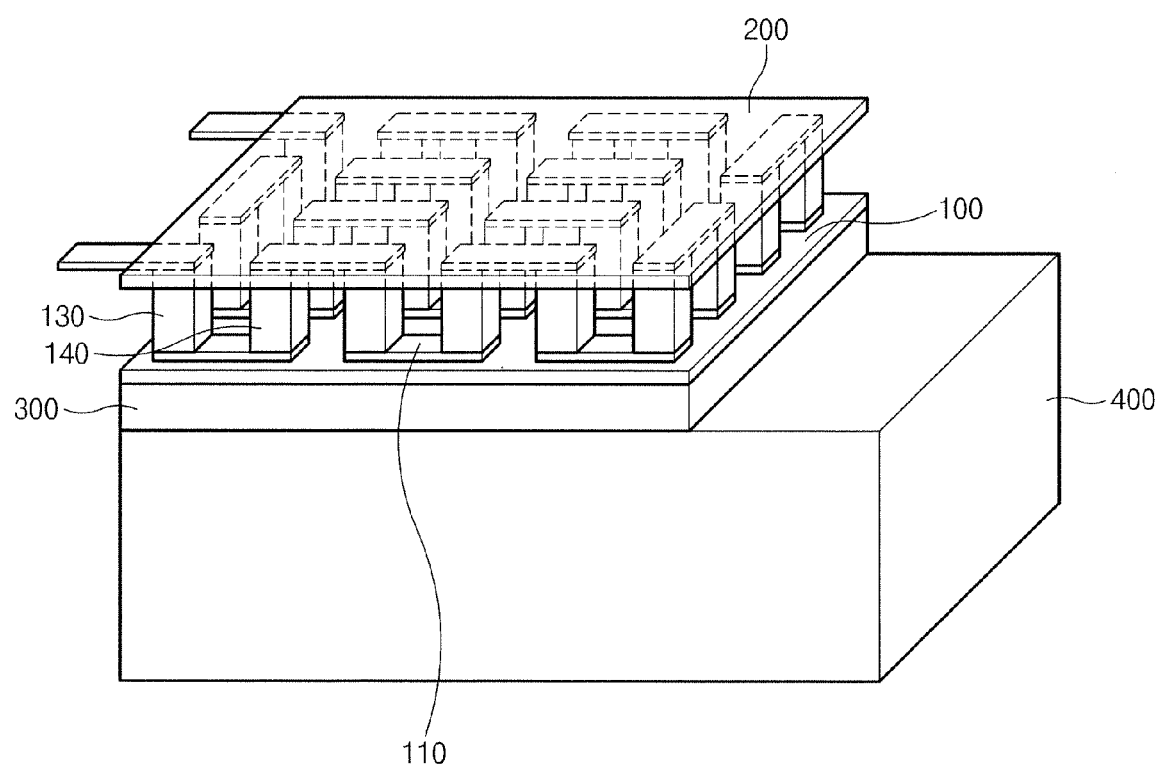
FIG. 1 is a perspective view of main parts of a thermoelectric generation apparatus according to an exemplary embodiment of the present inventive concept.
Figure 2:
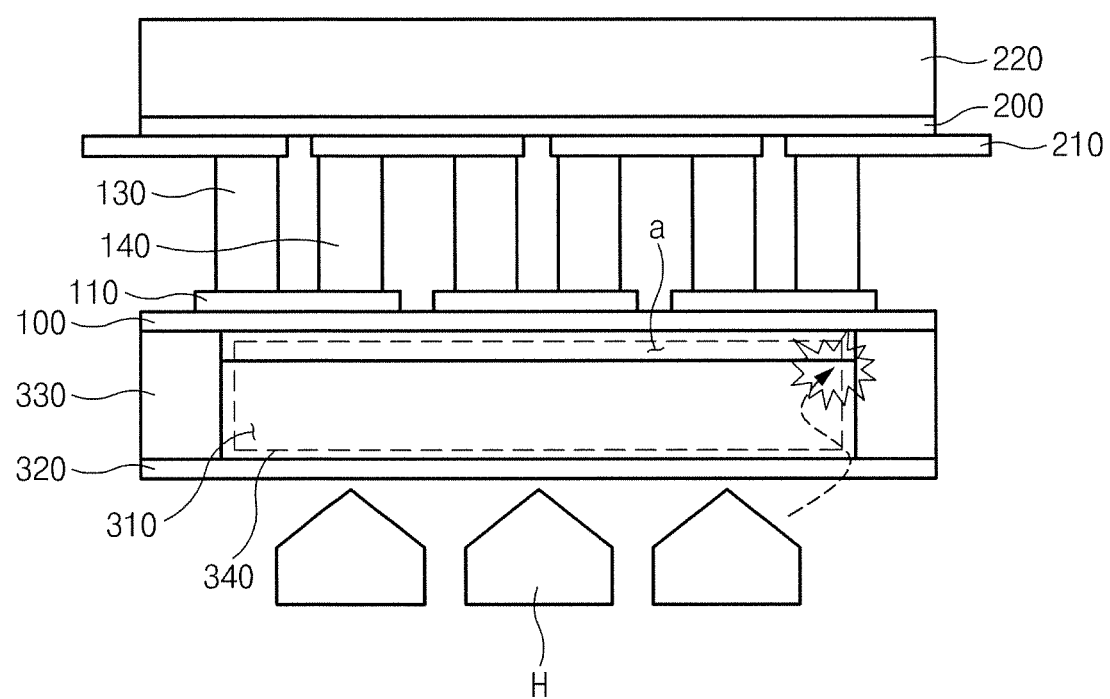
FIG. 2 is a view illustrating a heat conduction state of the thermoelectric generation apparatus of FIG. 1.
Figure 3:
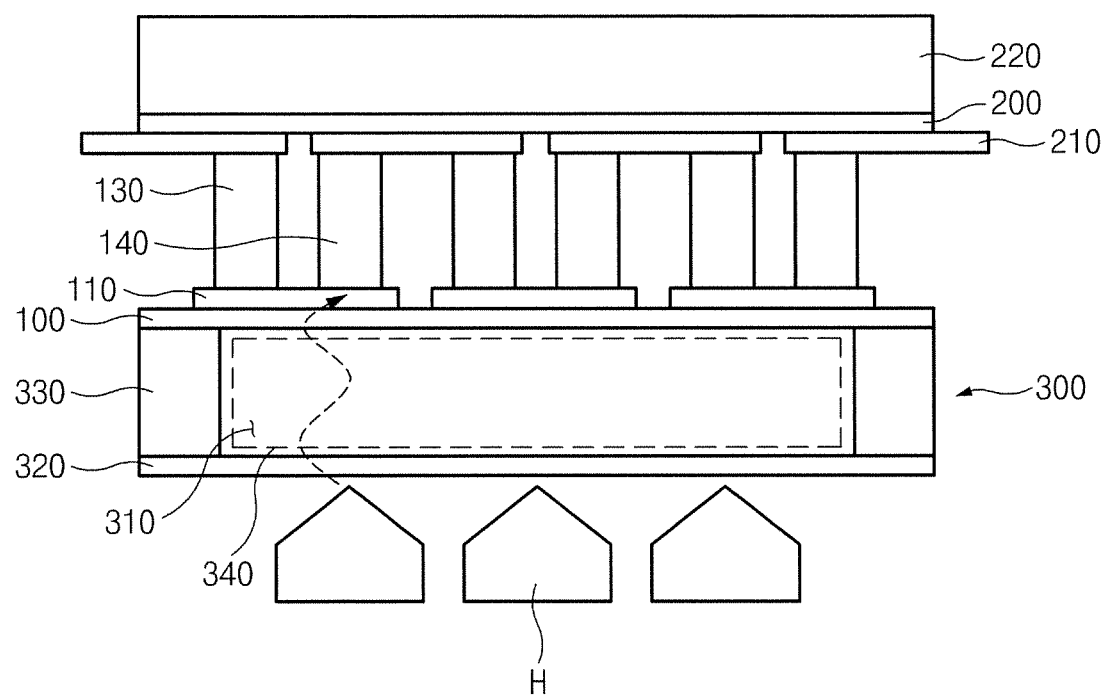
FIG. 3 is a view illustrating another heat conduction state of the thermoelectric generation apparatus of FIG. 1.
Figure 4:
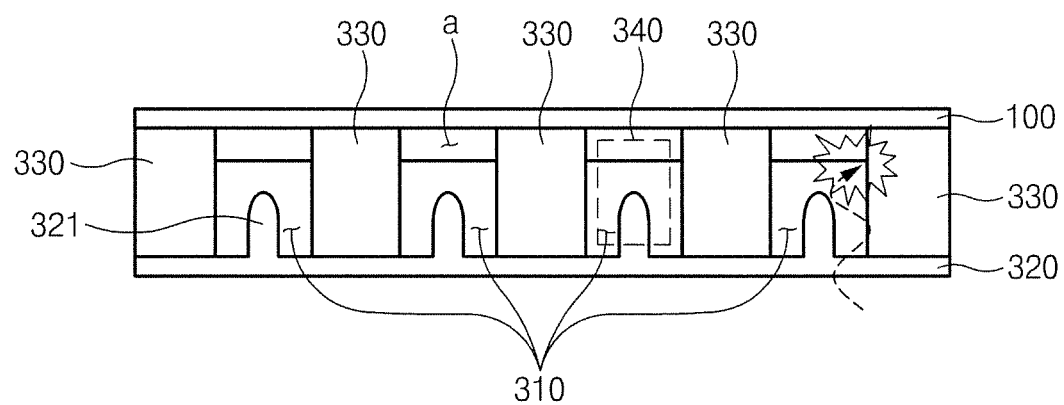
FIG. 4 is a view illustrating a conductive converting part included in the thermoelectric generation apparatus of FIG. 1.

As illustrated in FIGS. 1 to 4, a thermoelectric generation apparatus according to an exemplary embodiment of the present inventive concept is configured to include a heat absorbing surface 100 absorbing heat H from an internal combustion engine 400, a heat generating surface 200 bonded to the heat absorbing surface 100 by a semiconductor and discharging the heat to the outside, and a conductive converting part 300 interposed between the heat absorbing surface 100 and the internal combustion engine 400 and allowing the heat H to be conducted from the internal combustion engine 400 to the heat absorbing surface 100 when a temperature of the internal combustion engine 400 is equal to or greater than a specific value.

In certain embodiments, the conductive converting part 300 includes a phase change material 310 therein, the phase change material 310 capable of being phase-changed from a solid phase to a liquid phase and being expanded when the heat H transferred from the internal combustion engine 400 is equal to or greater than a heat reference value. In certain embodiments, the phase change material 310 may be embedded in the conductive converting part 300. The phase change material 310 is phase-changed at a specific temperature depending on what type of material is used. For example, a phase change temperature of an organic phase change material (for example, paraffin 14-carbons, benzamide) is about 5 to 127° C. A metal based phase change material (for example, Al, Cu, Ag, Fe, Li, or the like) is phase-changed at a high temperature of 200° C. or more.

In certain embodiments, the phase change material 310 may be made of a mixture of an organic material and a metal based material in order to be optimized for the highest temperature of a portion at which the thermoelectric generation apparatus is mounted, that is, the internal combustion engine 400 or a temperature of the internal combustion engine 400 at which it is desired that the thermoelectric generation apparatus be operated. In certain embodiments, the phase change material 310 may be made of a mixture of an organic material and a metal based material in order to operate at a specific temperature.

In an exemplary embodiment of the present inventive concept, the specific value may be equal to or greater than an activity temperature of an exhaust gas post-processing apparatus mounted in an exhaust pipe. Since the phase change material 310 is phase-changed and connects the heat absorbing surface 100 and the internal combustion engine 400 to each other only at a temperature of the specific value or more, a driving temperature of the thermoelectric generation apparatus may be controlled. In addition, electric power may be generated without having an influence on the activity temperature of the post-processing apparatus.

In certain embodiments, the phase change material 310 may contain 50 wt % or more of mixed filler raising thermal conductivity. In certain embodiments, the mixed filler is a mixture of any one or more of graphite, carbon fiber, ceramic fiber, and various metal fillers.

In certain embodiments, the conductive converting part 300 includes a base surface 320 attached to a surface of the internal combustion engine 400 and a plurality of insulation pillars 330 protruding from the base surface 320 at a predetermined height. In certain embodiments, the insulation pillars 330 are attached to the heat absorbing surface 100 so that the base surface 320 is horizontal to the heat absorbing surface 100. In certain embodiments, the phase change material 310 is inserted into each of a plurality of spaces 340 formed between the insulation pillars 330.

In certain embodiments, the volume of the phase change material 310 inserted into the spaces 340 is less than a volume of the spaces 340. That is, in certain embodiments, an air layer a is formed in the space 340, such that movement of the heat H by conduction is not generated between the heat absorbing surface 100 and the base surface 320 before the phase change material 310 is expanded while being phase-changed. The phase change material 310 is expanded toward the air layer a while being phase-changed, thereby connecting the base surface 320 and the heat absorbing surface 100 to each other.

In an exemplary embodiment of the present inventive concept, the base surface 320 is made of conductive ceramic. In certain embodiments, the insulation pillar 330 is made of any one of aerogel having low thermal conductivity and high heat resistance plastic. In certain embodiments, the base surface 320 has a plurality of pins 321 formed thereon so as to each protrude toward the plurality of spaces 340 formed between the insulation pillars 330.

In certain embodiments heat absorbing surface 100 and the heat generating surface 200 have a plurality of portions of conductive metal 110 and 210 attached thereto, respectively, and the portions of conductive metal 110 attached to the heat absorbing surface 100 and the portions of conductive metal 210 attached to the heat generating surface 200 are connected in series with each other through n-type materials 130 and p-type materials 140.

in certain embodiments, any one of a cooling jacket 220 in which a coolant moves, and a cooling fin and a cooling pipe formed to protrude toward air moving at the outside may be mounted on the heat generating surface 200.

As described above, according to exemplary embodiments of the present inventive concept, a thermoelectric generator absorbs heat of the internal combustion engine when a temperature of the internal combustion engine is equal to or greater than a specific temperature, thereby making it possible to obtain a constant open circuit voltage without having a negative influence on activity of a post-processing apparatus.

Hereinabove, although the present inventive concept has been described with reference to exemplary embodiments and the accompanying drawings, the present inventive concept is not limited thereto, but may be variously modified and altered by those skilled in the art to which the present inventive concept pertains without departing from the spirit and scope of the present inventive concept claimed in the following claims.

What is claimed is:

1. A thermoelectric generation apparatus comprising:
a heat absorbing surface configured to absorb heat from an internal combustion engine;
a heat generating surface bonded to the heat absorbing surface by a semiconductor and configured to discharge the heat to the outside; and
a conductive converting part interposed between the heat absorbing surface and the internal combustion engine,
wherein the conductive converting part has a base surface attached to a surface of the internal combustion engine, a plurality of insulation pillars protruding from the base surface at a predetermined height and attached to the heat absorbing surface, and a phase change material is inserted into a plurality of spaces formed between the insulation pillars, and
wherein the base surface has a plurality of pins formed thereon, the pins protruding toward the plurality of spaces formed between the insulation pillars.

2. The thermoelectric generation apparatus according to claim 1, wherein the phase change material capable of phase-changing from a solid phase to a liquid phase and being expanded when the heat transferred from the internal combustion engine is equal to or greater than a heat reference value.

3. The thermoelectric generation apparatus according to claim 2,
wherein the conductive converting part is configured to allow the heat to be conducted from the internal combustion engine to the heat absorbing surface when a temperature of the internal combustion engine is equal to or greater than a specific value, and
wherein the specific value is greater than or equal to an activity temperature of an exhaust gas post-processing apparatus mounted in an exhaust pipe.

4. The thermoelectric generation apparatus according to claim 2, wherein the phase change material contains a mixed filler that raises thermal conductivity, wherein the mixed filler is 50 wt % or more of the phase change material.

5. The thermoelectric generation apparatus according to claim 4, wherein the mixed filler is selected from the group consisting of graphite, carbon fiber, ceramic fiber, various metal fillers, and mixtures thereof.

6. The thermoelectric generation apparatus according to claim 1, wherein the base surface is horizontal to the heat absorbing surface.

7. The thermoelectric generation apparatus according to claim 1, wherein a volume of the phase change material inserted into the spaces is less than a volume of the spaces.

8. The thermoelectric generation apparatus according to claim 1, wherein the phase change material connects the base surface to the heat absorbing surface after being expanded during a phase change.

9. The thermoelectric generation apparatus according to claim 1, wherein the base surface comprises a conductive ceramic.

10. The thermoelectric generation apparatus according to claim 1, wherein the insulation pillar comprises an aerogel having low thermal conductivity or a high heat resistance plastic.

11. The thermoelectric generation apparatus according to claim 1, wherein the heat absorbing surface and the heat generating surface each have a plurality of conductive metal portions attached thereto, and
the conductive metal portions attached to the heat absorbing surface and the conductive metal portions attached to the heat generating surface are connected in series through n-type materials and p-type materials.

12. The thermoelectric generation apparatus according to claim 1, wherein a cooling jacket in which a coolant moves, a cooling fin, or a cooling pipe is mounted on the heat generating surface.

* * * * *